(12) United States Patent
Carrere et al.

(10) Patent No.: US 7,469,391 B2
(45) Date of Patent: Dec. 23, 2008

(54) METHOD AND DEVICE OF ANALYZING CROSSTALK EFFECTS IN AN ELECTRONIC DEVICE

(75) Inventors: Matthieu Carrere, Nice (FR); Robert Häußler, Augsburg (DE); Pierrick Pedron, Antibes (FR); Carsten Rau, München (DE); Birgit Sanders, Haar (DE)

(73) Assignee: Infineon Technologies AG, Munich (DE)

( * ) Notice: Subject to any disclaimer, the term of this patent is extended or adjusted under 35 U.S.C. 154(b) by 403 days.

(21) Appl. No.: 11/291,090

(22) Filed: Nov. 30, 2005

(65) Prior Publication Data

US 2006/0143584 A1 Jun. 29, 2006

(30) Foreign Application Priority Data

Nov. 30, 2004 (EP) .................................. 04292832

(51) Int. Cl.
*G06F 17/50* (2006.01)
(52) U.S. Cl. ..................................... 716/4; 716/5; 716/6
(58) Field of Classification Search ................. 716/4–6; 703/19
See application file for complete search history.

(56) References Cited

U.S. PATENT DOCUMENTS

| 6,253,359 | B1 * | 6/2001 | Cano et al. ...................... 716/6 |
| 6,327,542 | B1 * | 12/2001 | McBride ....................... 702/64 |
| 6,370,674 | B1 | 4/2002 | Thill |
| 6,378,109 | B1 | 4/2002 | Young et al. |
| 6,732,065 | B1 | 5/2004 | Muddu |
| 6,772,403 | B1 | 8/2004 | Sasaki |
| 6,799,153 | B1 * | 9/2004 | Sirichotiyakul et al. ........ 703/19 |
| 2002/0193959 | A1 * | 12/2002 | Wanek et al. ................ 702/117 |
| 2003/0115557 | A1 | 6/2003 | Elzinga |

OTHER PUBLICATIONS

Sirichotiyakul et al., "Driver Modeling and Alignment for Worst-Case Delay Noise," Proceedings of the 38th Annual Design Automation Conference, Jun. 2001, pp. 720-725, (6 pages).
Lauren Hui Chen et al., "Aggressor Alignment for Worst-Case Coupling Noise,", Proceedings International Symposium on Physical Design, Apr. 2000, pp. 48-54, (7 pages).

* cited by examiner

*Primary Examiner*—Paul Dinh
(74) *Attorney, Agent, or Firm*—Maginot, Moore & Beck

(57) ABSTRACT

For analyzing the effects of crosstalk in an electronic device, a model description of the electronic device is provided which defines a victim net and at least one aggressor net, the model description allowing for simulating the dynamic response behaviour at an output of the victim net with respect to an input signal of the victim net and/or of the at least one aggressor net. A characteristic property of the response behaviour at the output of the victim net is represented as an output function of the simulation, the value of the output function depending on input parameters of the simulation. The output function is evaluated as to find an extremum of the output function in a preset range of the input parameters. The characteristic property may in particular be a measure of the delay of the output signal of the victim net with respect to the input signal of the victim net, the input parameters corresponding to the timing of a signal transition applied to the input of the at least one aggressor net with respect to the timing of a signal transition applied to the input of the victim net.

23 Claims, 7 Drawing Sheets

METHOD AND DEVICE OF ANALYZING CROSSTALK EFFECTS IN AN ELECTRONIC DEVICE

FIELD OF THE INVENTION

The present invention relates to a method and a device for analyzing crosstalk effects in an electronic device. In particular, a methodology is presented which allows for accurately measuring the crosstalk effects on a complete signal path when doing a simulation at the transistor level.

BACKGROUND

With decreasing feature sizes in semiconductor technology, it is obvious that effects due to crosstalk, in particular delay effects, can have a significant impact on the operation of an electronic device. Several commercially available tools for electronic design automation are now capable of calculating the delay effects of crosstalk. These tools operate on the basis of a gate-level description and can therefore not provide the required accuracy for giving a reliable estimate of the effects of crosstalk. Hence, it is desirable to calculate the effects of crosstalk on the basis of a transistor-level description, taking into account the non-linear behaviour of the transistors, so as to be able to verify the results provided by tools which are based on a gate-level representation of the electronic device.

When discussing crosstalk effects on the basis of a transistor-level representation of an electronic device, one may generally consider a situation as depicted in FIG. 7. FIG. 7 shows two RC-nets which will in the following be referred to as victim net 10 and aggressor net 20. These RC-nets generally consist of resistors 6 and capacitors 8, 9. In particular, the aggressor net 20 is coupled to the victim net 10 via a coupling capacitor 8. Further, both the victim net 10 and the aggressor net 20 are coupled to ground via a coupling capacitor 9. Input signals, in FIG. 7 schematically shown at 12 and 22, are supplied to the victim net 10 and the aggressor net 20 via driver stages 4. Similarly, an output signal at the output of the victim net 10 and the aggressor net 20 is received by an output side driver stage 4, which represents an output load to the victim net 10 and the aggressor net 20.

The signal situation is illustrated in FIGS. 8(a) and (b). Here one can distinguish between two different situations in which crosstalk has an effect on the response behaviour observe at an output of the victim net, i.e. at the output of the output side driver stage 4.

The first situation is illustrated in FIG. 8(a) and corresponds to the case that a signal transition is applied both to the input side driver stage 4 of the victim net 10 and to the input side driver stage 4 of the aggressor net 20. In FIG. 8(a) the input signal of the aggressor net 20 is shown as a function of time and denoted by A. The output signal of the victim net, taking into account the effects of crosstalk, is denoted by V. For comparison, the output signal of the victim net 10 is shown as a dashed line denoted by V'. As can be seen, the output signal V of the victim net is significantly affected by the signal transition applied to the aggressor net 20.

Two effects can be seen from the illustration of FIG. 8(a): Firstly, the rising edge of the output signal V of the victim net 10 is shifted to a later time as compared to the behaviour of the output signal V' without the influence of crosstalk. This crosstalk-induced delay is in FIG. 8(a) denoted by Δt. Secondly, the slope of the rising edge of the output signal V of the victim net 10 is modified. In particular, the transition time, which may be defined as the difference in time between a first time $t_1$, at which the output signal V has increased to 20% of the total amplitude Δx of the output signal V, and a second time $t_2$, at which the output signal V has increased to 80% of the total amplitude Δx, is significantly larger as compared to the situation without crosstalk.

In FIG. 8(a) there is also shown a situation in which the signal transition of the aggressor net is directed into the same direction as the signal transition of the victim net 10. This is illustrated by dotted lines denoted by A' and V'''. Here, the effect of crosstalk is to shift the signal transition observed at the output of the victim net 10 to an earlier point of time.

A second situation is illustrated in FIG. 8(b). This situation corresponds to the case in which no signal transition is present on the victim net 10. Again, the input signal of the aggressor net 20 is denoted by A, the output signal of the victim net 10 is denoted by V, and the output signal of the victim net 10 neglecting the influence of crosstalk is denoted by V'. As can be seen from the dashed line, the output signal V' without the influence of crosstalk remains at a constant value, while a bump occurs in the output signal V which is due to the capacitive coupling between the victim net 10 and the aggressor net 20. The maximum deviation of the output signal V from the behaviour of the output signal V' without crosstalk is in FIG. 8(b) denoted by xn and represents the amplitude of noise induced by crosstalk. Of course, instead of using the amplitude xn of the crosstalk-induced noise, the crosstalk-induced noise may also be quantified in terms of a signal power or in terms of the area enclosed between the trajectories of the output signal V with crosstalk and the output signal V' without crosstalk.

For electronic circuit designs with practical relevance the situation is, however, more complex. FIG. 9 illustrates a signal path of an electronic device which consists of a sequence of RC-nets connecting a path start point 110 with a path end point 120. The RC-nets are connected one after the other via driver structures 4. Each of the RC-nets forms a victim net 10 which is capacitively coupled to at least one aggressor net 20. As in FIG. 8, the victim nets 10 and the aggressor nets 20 are also capacitively coupled to ground. When running simulations of such a full signal path 100 on a transistor level the effects of all the aggressor nets would have to be considered simultaneously for each victim net 10 of the signal path 100. This is entrained by a very long run time of the simulation and renders this approach impracticable for signal paths in typical electronic circuit designs. Moreover, each of the aggressor nets 20 typically has connected to its input side driver structure 4 a more or less complicated logic circuit structure, which further complicates the simulation.

Therefore, accurate and efficient simulations of the effects of crosstalk, which are based on a transistor-level model description, e.g. using SPICE or HSPICE, have not been practicable.

SUMMARY

In view of the foregoing issues, the present invention provides a solution which allows for an accurate and at the same time efficient analysis of crosstalk effects in an electronic device and which is in particular also applicable to an entire signal path consisting of a sequence of multiple RC-nets capacitively coupled to a plurality of aggressor nets.

This object is achieved by a method and a device according to advantageous embodiments of the invention.

According to the method of the present invention, a model description of an electronic device is provided, e.g. using a transistor-level description such as SPICE or HSPICE, which takes into account the non-linear behaviour of the transistors. The description defines a victim net and at least one aggressor net, which are generally RC-nets and are capacitively coupled to each other. The model description is configured to allow for simulating the dynamic response behaviour at an output of the victim net with respect to an input signal of the victim net and/or of the at least one aggressor net. A characteristic property of the response behaviour at the output of the victim net is represented as an output function of the simulation, the value of the output function depending on input parameters of the simulation.

The output function may in particular represent a measure of noise induced in the output signal of the victim net, a measure of delay of the output signal of the victim net with respect to the input signal of the victim net or a measure of the transition time of a signal transition observed at the output of the victim net. Depending on the particular focus of the analysis, the output function may also be defined to represent other characteristic properties of the response behaviour of the output signal.

According to the invention, the output function is evaluated so as to find an extremum of the output function in a preset range of the input parameters. The extremum may be either a global minimum or a global maximum of the output function. Preferably not only the value of the extremum is determined but also its position, i.e. the corresponding values of the input parameters. The input parameters may in particular correspond to the timing of the input signal of the at least one aggressor net relative to the timing of the input signal of the victim net. Other possible input parameters can be the amplitude or total magnitude of the input signal or the slope of a signal transition, e.g. represented by the transition time.

The approach of defining an output function of the simulation and evaluating its extremum in a preset range of parameters allows for a highly accurate and at the same time also efficient determination of a worst-case-scenario, in which the crosstalk originating from the at least one aggressor net has the most significant impact. The worst-case-scenario is particularly relevant as it provides an upper limit for crosstalk effects which may occur during operation of the electronic device. At the same time, the analysis is very efficient as it is not required to simulate the input signals of the aggressor net and the victim net starting from the original inputs of the electronic device. Instead, a range is defined for the input parameters of the simulation which includes configurations of the input signals that can occur in practice. However, not all configurations of the input signals which can occur during operation of the electronic device have to be simulated but only those which are necessary for finding the extremum of the output function. This is especially advantageous in the case of aggressor nets which have connected to their input a complex logic circuitry with multiple inputs.

Preferably, the extremum of the output function is evaluated by means of an optimization algorithm, e.g. an optimization algorithm corresponding to a so-called simplex downhill approach, a so-called differential evolution approach, a simulated annealing approach or combinations of them. By using such a global optimization algorithm, the number of simulations required to find the extremum of the output function is reduced and thereby the efficiency of the method increased.

Before applying the optimization algorithm, it is preferable to transform the output function by means of a transformation which conserves the position of the extremum. Generally, the transformation will transform the output function to a transformed output function depending on transformed input parameters. The transformed output function has its extremum at values of the transformed input parameters which correspond to those original input parameters at which the original output function has its extremum. By means of such a transformation, the speed of convergence of the optimization algorithm can be increased and the number of simulations required to find the extremum reduced. Preferably, the transformed input parameters correspond to the original input parameters such that a back-transformation is not required to find the values of the original input parameters corresponding to the extremum of the original output function.

To increase the accuracy of the simulation, an input driver structure of the victim net and/or the aggressor net can be included into the simulation. In this case, the input signal of the victim net is simulated based on an input signal of the driver structure. As input signal of the driver structure a signal transition having an idealized wave form parameterized by a number of parameters is used. The idealized waveform may in particular be a piecewise linear model. These parameters are then used as input parameters of the model simulation. The driver structure can in particular include a further victim net located upstream from the presently evaluated victim net, the further victim net being part of a sequence of victim nets forming a signal path of the electronic device.

It is also preferable to include an output stage of the victim net and/or the aggressor net into the simulation. This further enhances the accuracy of the simulation. The output load stage of the victim net may in particular include a driver connecting the victim net to a next victim net of a sequence of victim nets forming a signal path of the electronic device.

When analyzing the effect of crosstalk on such a signal path which consists of a sequence of at least two RC-nets, which each may form a victim net capacitively coupled to at least one aggressor net, it is preferable to use a levelized concept for simulating the effect of crosstalk on each of the victim nets. For this purpose, it is started with evaluating the first victim net of the signal path so as to find the extremum of the output function corresponding to this victim net. Depending on the values of the input parameters corresponding to the extremum of the output function, e.g. depending on the position of the extremum, at least one parameter descriptive of the output signal of the victim net is evaluated: Of course, the at least one parameter may correspond to the characteristic property represented by the output function. Preferably multiple parameters are evaluated of which at least some are selected to correspond to the parameters used for parameterizing the wave form of the input signals. Then the next victim net of the sequence is evaluated in a similar fashion. Here, at least one of the input parameters of the simulation is selected depending on the at least one parameter obtained for the previously evaluated victim net or depending on the values of the input parameters corresponding to the extremum evaluated for the previously evaluated victim net. The latter evaluation step is preferably repeated until the last victim net of the sequence has been evaluated.

By means of the levelized concept for evaluating the sequence of victim nets, relevant information concerning the input parameters for the simulation of the next victim net of the sequence can be propagated through the signal path, without that the detailed wave form of the signal would have to be propagated from one victim net to the next victim net throughout the signal path. Moreover, the information handed over from one victim net to the next is restricted to the most relevant case, i.e. the worst-case-scenario. In effect, a worst-case-scenario is analyzed for the entire signal path.

Preferably, the values of the at least one parameter obtained for each of the victim nets during the levelized simulation are combined so as to obtain a value of the parameter corresponding to the entire signal path. For example, the total delay of the signal path can be obtained by adding the delays simulated for each of the victim nets.

In the levelized simulation, the downstream sequence of victim nets, i.e. the victim nets which are located downstream form the presently evaluated victim net and are not included in the simulation, is included into the model simulation as a capacitive output load. This is preferably achieved by determining the total capacitance of the downstream sequence of victim nets and including it into the model description as a capacitive output load of the simulated circuit structure with respect to ground.

The device according to the present invention comprises processing means for processing descriptive data of an electronic device. The descriptive data, which may correspond to a transistor-level description such as SPICE or HSPICE, defines a victim net and at least one aggressor net capacitively coupled to the victim net. The processing means are configured to simulate the response behaviour at an output of the victim net with respect to an input signal of the victim net and/or of the at least one aggressor net. Further, the processing means are configured to represent a characteristic property of the response behaviour at the output of the victim net as an output function of the simulation, the value of the output function depending on input parameters of the simulation. The processing means are further configured to evaluate the output function so as to find an extremum of the output function in preset range of the input parameters.

The device is preferably configured to perform the method described above. The device according to the present invention may in particular be implemented as a computer system having a corresponding computer software. Therefore, the present application also relates to a computer software product comprising a computer executable program code which is designed to implement the method according to the present invention when executed on a computer system.

As can be seen from the above, the present invention provides a highly efficient and accurate way for analyzing the effect of crosstalk in an electronic device. The concept of the present invention can be applied to different characteristic properties of the response behaviour observes at the output of a victim net or an entire signal path. The concept of the present invention can be applied not only to integrated electronic circuitry but also to electronic bus systems. It is particularly suitable for verifying the results of tools for electronic design automation, in particular those which are based on a gate-level description and therefore cannot provide for an accurate analysis of the effects of crosstalk.

Further features and advantages of the present invention will be apparent from the following description of a preferred embodiment, which is given by reference to the accompanying drawings.

DETAILED DESCRIPTION

In the following, a method for analyzing crosstalk effects in an electronic device, such as a semiconductor chip with high-density integrated electronic circuitry, will be described. The method is preferably implemented on a computer system by means of a suitably designed computer software. The method is based on a transistor-level model description of the electronic device using a computer implemented description tool working on the transistor level, such as SPICE or HSPICE. The following description will focus on the particular case of analyzing crosstalk induced delay. However, the method is also applicable to analyze other crosstalk induced effects, such as crosstalk induced noise or the effects of crosstalk on the transition time of a signal.

Figure 1:
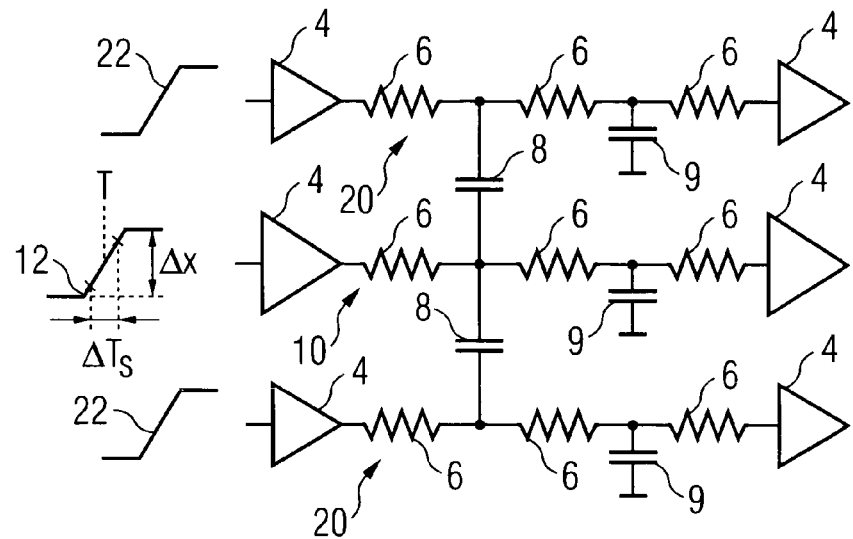
FIG. 1 schematically illustrates a model description of a part of an electronic device, comprising a victim net and two aggressor nets, the model description being suitable for analyzing the effect of crosstalk according to an embodiment of the invention.

A partial model description of an electronic device is shown in FIG. 1. The description includes a victim net 10 and two aggressor nets 20 which are capacitively coupled to the victim net 10 via coupling capacitors 8. The victim net 10 as well as the aggressor nets 20 basically consist of resistors 6 and capacitors 8, 9, i.e. can be considered as RC-nets. Besides the coupling capacitors 8 which couple the aggressor nets 20 to the victim net 10, each of the victim net 10 and the aggressor nets 20 includes a coupling capacitor 9 which couples the respective victim net 10 or aggressor net 20 to ground. The capacitance values of the coupling capacitors 8, 9 are herein referred to as coupling capacitances.

At inputs and outputs of the victim net 10 and the aggressor net 20 driver stages 4 are shown. The input side driver stages 4 feeds an input signal, schematically illustrated at 12 and 22, into the respective victim 10 or aggressor net 20. The input signal may be an input signal of the electronic device or an output signal of further circuit components which are located, in a propagating direction of signals, upstream from the victim net 10 or the aggressor nets 20. Similarly, an output side driver stage 4 is located at the respective outputs of the victim net 10 and the aggressor nets 20. The output side driver stage 4 can be an output driver of the electronic device or an input driver of circuitry located downstream from the victim net 10 or aggressor nets 20.

For analyzing the effects of crosstalk, the response behaviour at the output of the victim net with respect to the input signals 12, 22 of the victim net 10 and the aggressor nets 20 is simulated on the basis of the analog signal transmission properties of the RC-network formed by the victim net 10 and the aggressor nets 20. For this purpose, in the simulation, the signal inputs of the input side driver stages 4 are subjected to a signal transition having an idealized wave form. The idealized wave form is parameterized by a number of parameters which preferably include the time T of the signal transition, the amplitude $\Delta X$ of the signal transition and the slope or transition time $\Delta T_s$ of the signal transition. By this means, the input signal of the driver stage 4 can be described on the basis of a limited number of parameters. The parameters of the input signals of the victim net 10 and the aggressor nets 20 are used as input parameters of the simulation.

For describing a characteristic property of the output behaviour at the output of the victim net 10 an output function of the simulation is defined. This is preferably accomplished by encapsulating the computer implemented simulation using a script in a high-level programming language, e.g. Perl, such that the parameters of the simulation are handed over upon calling the script and the value of the characteristic property is returned as a result. By this means an output function $F(X1, \ldots, Xn)$ of the simulation is defined, wherein $X1, \ldots, Xn$ correspond to the input parameters of the simulation.

According to the described method an output function can be defined for different characteristic properties such as the delay $\Delta t$ of the output signal of the victim net 10 with respect to the input signal of the victim net 10 or the transition time s of the output signal of the victim net 10. Another interesting characteristic property which can be described by the output function is the amplitude or signal power of noise induced by crosstalk in the victim net 10 when no input signal is present at the input of the victim net 10.

With respect to analyzing the effects of crosstalk induced delay, it is of particular interest to evaluate the delay by means of an output function which is a measure of the delay and depends on the timings of the input signals 22 of the aggressor nets 20 relative to the timing of the input signal 12 of the victim net 10. Of particular interest is that scenario in which the combined effects of crosstalk from the aggressor nets 20 result in the strongest delay of the output signal of the victim net. This situation will in the following by referred to as a worst-case-scenario. Knowledge of the worst-case-scenario is an important aspect as the worst-case-scenario is the most relevant situation with respect to malfunctioning of the electronic device. Based on this knowledge it is possible to carry out further investigations, e.g. on the probability of such a malfunctioning.

As the worst-case-scenario typically does not correspond to the situation in which the input signals of the aggressor nets 20 are aligned with the input signal of the victim net, finding the worst-case-scenario is not a trivial task. Typically, inaccuracy of less then a picosecond is required for finding the relative timings of the input signals 12, 22 which correspond to the worst-case-scenario.

One possible solution is to define a timing window for each of the aggressor nets 20, i.e. to define a preset range of the input parameters, and to evaluate the output function at values of the input parameters which are spaced in equidistant intervals. The timing window for the aggressor nets 20 is preferably selected to extend over a sufficiently large period starting before the signal transition of the victim net 10. A window size suitable for practical use extends from a starting time of the signal transition in the input signal 12 of the victim net 10 minus a full transition time of the input signal of the victim net to the end point of the signal transition in the input signal 12 of the victim net 10. Evaluating the output function corresponding to the delay at values of the relative timing corresponding to 20 equal intervals was shown to give reasonable results. From the calculated values of the output function corresponding to the delay, the maximum delay is selected, to identify the worst-case-scenario.

Another possibility for finding the worst-case-scenario is to evaluate the output function so as to find its extremum, i.e. minimum or maximum, by using a global optimization algorithm. For this purpose, the optimization algorithm is implemented in the high-level programming language which was also used to encapsulate the simulation. In the code of the optimization algorithm, the output function of the simulation is called as function and input parameters of the simulation are handed over. The result of the simulation, i.e. the value of the output function is returned as a result to the optimization algorithm. A Perl-implemented optimization using a so-called "simplex downhill" method is preferably used to evaluate the extremum of the output function. Of course, other optimization algorithms such as approaches based on differential evolution, simulated annealing, etc. are also possible. The simplex-downhill optimization algorithm was shown to reduce the number of evaluations of the output function by a factor of five hundred with respect to the evaluation of the output function at equally spaced value of the input parameters as described above.

It is also possible, that multiple output functions are defined, each representing a different characteristic property of the response behaviour at the output of the victim net 10. If these different output functions depend on the same input parameters, the evaluation so as to find the extremum is carried out for only one of the output functions and the other output functions are evaluated at values of their input parameters corresponding to the position of the extremum found for one of the output functions.

The simulation of the victim net 10 and aggressor nets 20 includes the effects of the input side driver stage 4 by simulating the effects of the driver stage 4 on its input signal 12, 22 having the idealized wave form. This means that a modified signal with a wave form reflecting the characteristics of the driver stage 4 is propagated into the victim net 10 and the aggressor net 20. The effects of the output side driver stage 4 are analyzed in a similar manner. Further, the output side driver stage 4 is taken into account as an output load of the victim net 10 and aggressor net 20.

Figure 2:
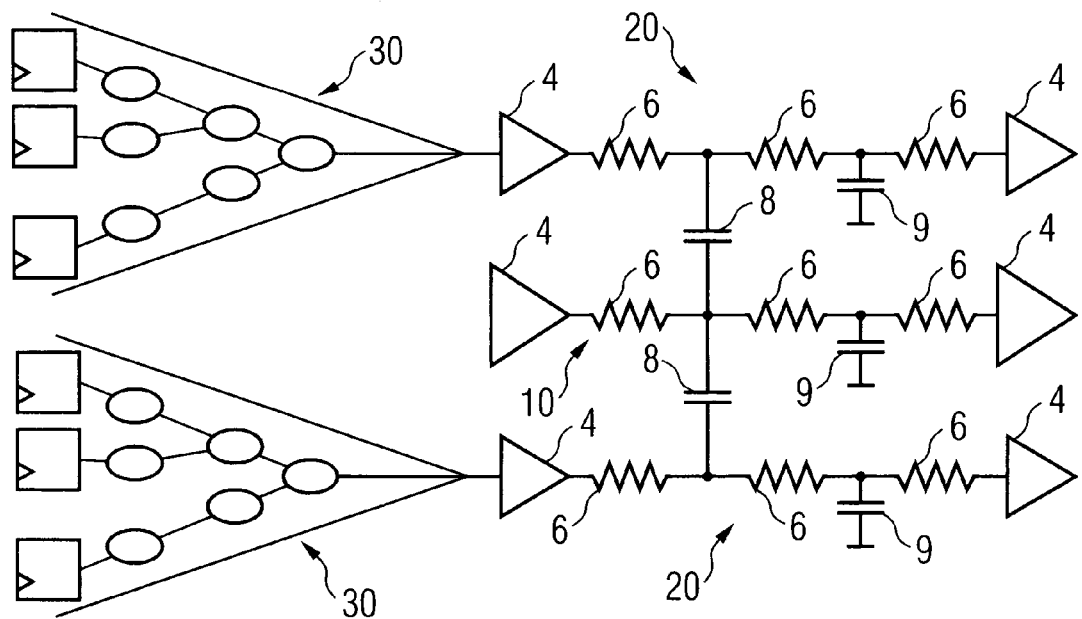
FIG. 2 schematically illustrates the model description of FIG. 1, further including logic circuitry connected to the inputs of the aggressor nets.

FIG. 2 illustrates a situation in which logic circuitry 30 is connected to the respective inputs of the aggressor nets 20. Here, a driver structure of the aggressor net 20 can be considered to be formed by the logic circuitry 30 and the actual driver stage 4 of the aggressor net 20.

As shown in FIG. 2, the driver structures of the aggressor net 20 have multiple inputs. In order to reduce the number of input parameters of the simulation, only one of the inputs of the driver structure is selected as an active input, i.e. as an input which is subjected to a signal transition. The other inputs of the driver structure are set to a constant value allowing for propagating the signal from the active input.

The selection of the active input is accomplished in a manner so as to select that input which is most relevant with respect to the worst-case-scenario. Here, two cases can be distinguished:

In a first case, the logic circuitry corresponds to a combinational circuit. In this case, the input which results in the smallest transition time of the signal applied to the input of the aggressor net is selected as the active input. The direction (rising or falling) of a signal transition applied to the active input is selected depending on the active input being inverting or non-inverting with respect to input of the aggressor net 20 and depending on the edge direction of the signal transition applied to the input of the victim net 10. This means, that when the input signal 12 of the victim net 10 has a rising edge and the active input is non-inverting with respect to the input of the aggressor net 20, the input signal applied to the active input is selected to have a falling edge, so that the maximum effect due to crosstalk is obtained in the response behaviour at the output of the victim net 10. Conversely, if the active input is inverting with respect to the input of the aggressor net 20 or the input signal of the victim net has a falling edge, an input signal having a rising edge is applied to the active input of the driver structure.

In a second case, the driver structure of the aggressor net 20 corresponds to a sequential circuit. Here, the clock input of the sequential circuit is selected as the active input of the driver structure. The edge direction of the signal transition applied to the active input is in this case depending on the inverting or non-inverting character of the active input with respect to the input of the aggressor net 20, the edge direction of the signal transition applied to the input of the victim net 10, and a data input constant value. In this case, an initialization step is needed for bringing the sequential circuit into a state in which a signal transition is produced at its output when a signal transition is applied to its active input, i.e. to its clock input. This means, for example, that if the input signal 12 of the victim net 10 has a rising edge, the sequential circuit is during the initialization step brought into a state in which its output is in a high signal state and its data input is in a low signal state. If now a signal transition with a rising or falling edge, depending on the non-inverting or inverting character of the clock input, is applied to the active input, a signal transition from the high state into the low state occurs at the output of the sequential circuit. This signal transition has an opposite direction with respect to the signal transition applied to the input of the victim net 10, such that the effects of crosstalk with respect to delay are maximized. Of course, there are other crosstalk-induced effects which are maximized if the signal transitions of the aggressor net and the victim net have the same edge direction.

As can be seen, the input signals applied to the active input of the driver structure of the aggressor nets 20 is selected in such a way that at the input of the aggressor nets 20 a signal transition is obtained which has an opposite edge direction with respect to the edge direction of the signal transition applied to the input of the victim net 10. Of course, this concept can also be generalized to combinations of combinational and sequential circuits.

Figure 3:
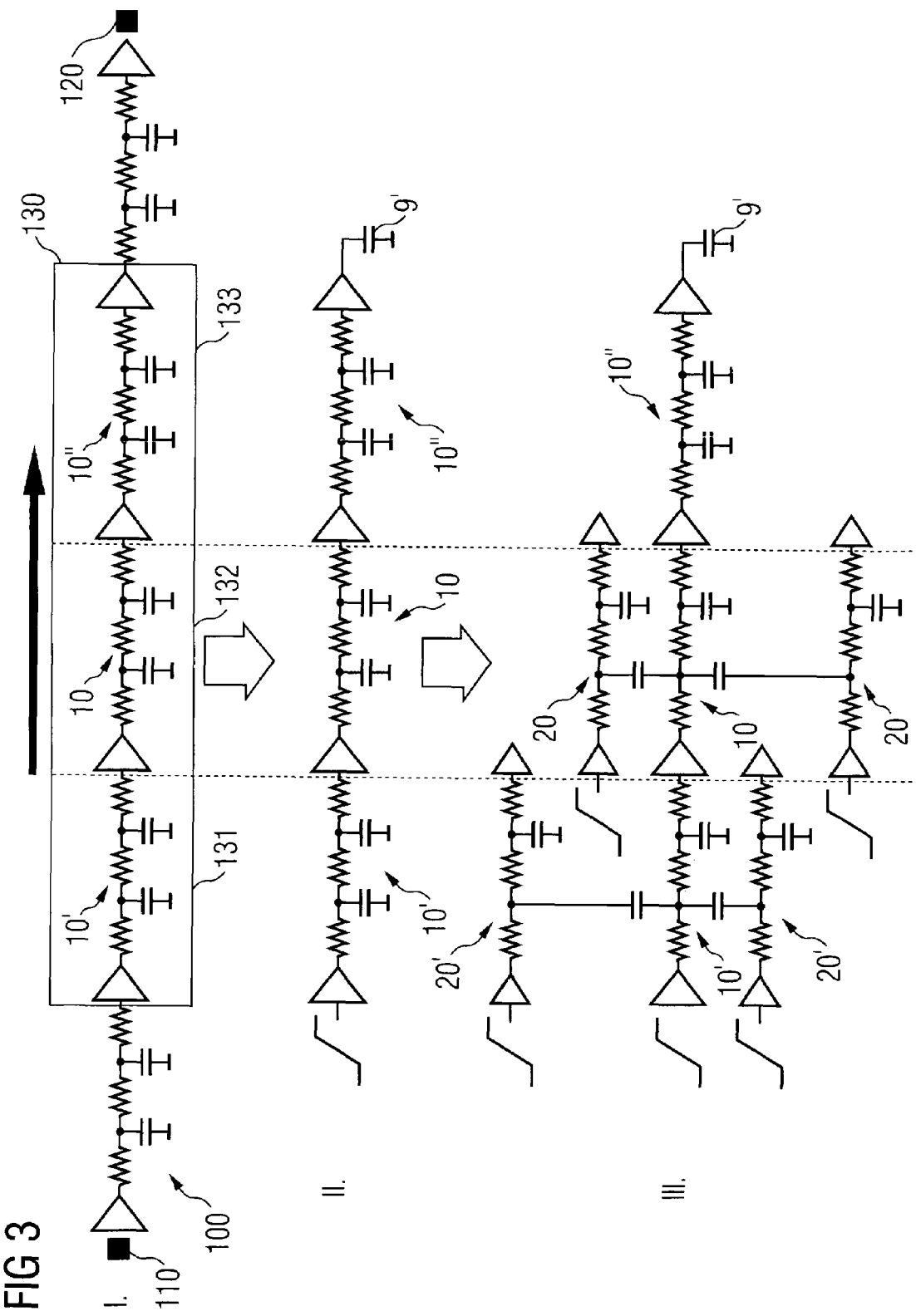
FIG. 3 schematically illustrates a method for analyzing the effects of crosstalk in an entire signal path of the electronic device, using a levelized simulation concept according to an embodiment of the invention.

FIG. 3 illustrates a method of analyzing the effects of crosstalk in a signal path 100 of the electronic device. The signal path 100, which may also be referred to as a timing path when specifically considering the effect of delay, extends from a path starting point 110 to a path end point 120. The signal path comprises a sequence of RC-nets which generally form victim nets 10, 10', 10" capacitively coupled to aggressor nets 20, 20'. For analyzing the effects of crosstalk on the signal path 100, a levelized concept is used for the simulation. This means that the victim nets 10, 10', 10" of the sequence are analyzed one after the other starting from the path starting point 110 and ending at the path end point 120. By means of a three-section simulation window, in the simulation, three different sections of the signal path are taken into account for the presently evaluated victim net 10. A first section 131 is located upstream from the presently evaluated victim net 10 and is formed by the victim net 10' which has been evaluated in a previous step or, in this case that the presently evaluated victim net 10 is the first victim net of the signal path 100, by the input of the signal path. A second or middle second section 132 is the presently analyzed victim net 10, in which the characteristic property is evaluated by means of the output function as explained above. The first section 131 of the three-section simulation window 130 is used to model the wave form applied to the input side driver stage of the presently evaluated victim net 10. An idealized wave form signal transition is applied to the input of the previously evaluated victim net 10' in the first section 131 of the three-section simulation window 130.

The third section 133 of the three-section simulation window 130 is formed by a victim net 10" located downstream from the presently evaluated victim net 10 or, in case that the presently evaluated victim net 10 is the last victim net 10 of the signal path 100, by an output of the signal path 100. The third section 133 of the three-section simulation window 130 is provided for modeling the output load seen by the output side driver or receiver of the presently evaluated victim net 10. In the three-section simulation window 130, the first section 131 can be considered as a driver structure of the presently evaluated victim net 10, and the third section can be considered as an output structure of the presently evaluated victim net 10.

The upper part of FIG. 3 denoted by I. shows the entire signal path and the three-section simulation window 130 being moved over the signal path 100 in course of the analysis.

In the next lower part, denoted by II., the model description used for simulating the three-section simulation window 130 without the influence of crosstalk is illustrated. For this simulation, a signal transition having idealized wave form is applied to the victim net 10' of the first section 131 and propagated through the victim net 10 of the second section and the victim net 10" of the third section. At the output of the victim net 10" of the third section, an output load capacitor 9' is included, which connects the output of the output side driver stage of the victim net 10" to ground. The capacitance value of this output load capacitor 9' is chosen to correspond to the total equivalent capacitance of all circuit structures located downstream from the victim net 10". A simulation neglecting the effects of crosstalk, based on the model description as shown in part II. of FIG. 3, can be carried out so as to obtain a reference for quantifying the crosstalk induced effects.

In the lower part of FIG. 3, denoted by III., a model description of a three-stage simulation window 130 is shown, in which the aggressor nets 20, 20' are included in the simulation for the victim net 10 and the victim net 10'. For the victim net 10", all the coupling capacitors are considered as grounded, even if aggressor nets are in fact also existing for the victim net 10".

For the victim net 10' of the first section, the worst-case-scenario has been evaluated in a previous analysis step, when this victim net 10' formed the middle section of the three-section simulation window. The input parameters obtained for this worst-case-scenario are now used when simulating the wave form to be applied to the input of the presently evaluated victim net 10, thereby taking into account the effects of crosstalk on the actual waveform. For the presently evaluated victim net 10, the worst-case-scenario is evaluated as described above. Here, parameters of the input signal of the aggressor nets 20 capacitively coupled to the presently evaluated victim net 10 form the input parameters depending on which the extremum of the output function is evaluated. For example, the maximum delay observed at the output of the victim net 10 can be evaluated depending on the relative timings of the input signals of the aggressor net 20 with respect to the input signal of the victim net 10' of the first section.

As can be seen, for the evaluation of the worst-case-scenario, the worst-case-scenario of previously evaluated victim nets which are located upstream in the signal path is automatically taken into account. Further, the actual wave form of the signal applied to the input of the presently evaluated victim net takes includes the effects of crosstalk on the victim net which is located upstream from the presently evaluated victim net. In this way, a highly accurate and at the same time efficient analysis of the effects of crosstalk is achieved.

To further reduce the computational effort, the aggressor nets can be filtered, i.e. only a part of the aggressor nets capacitively coupled to the victim net are included into the simulation. This selection of aggressor nets can be based on the relative value of the coupling capacitance of the aggressor net with respect to the total capacitance of the victim net, the total capacitance of the victim net, the total capacitance including all coupling capacitances with respect to aggressor nets and also coupling capacitances with respect to ground. A second possibility is to select aggressor net on the basis of the absolute value of their coupling capacitance with respect to the victim net.

A reason for also including third section 133, i.e. the victim net or output structure located downstream from the presently evaluated victim net into the evaluation of the worst-case-scenario is that the crosstalk effects influence both the delay and the transition time of the signal transition which is propagated through the victim net. The increase in transition time in turn effects the delay of a circuit structure located downstream from the victim net. Therefore, it is advantageous to include the output side circuit structure, such as a driver stage or an next victim net, into the simulation and to evaluate the response behaviour at the output of this structure.

Figure 4:
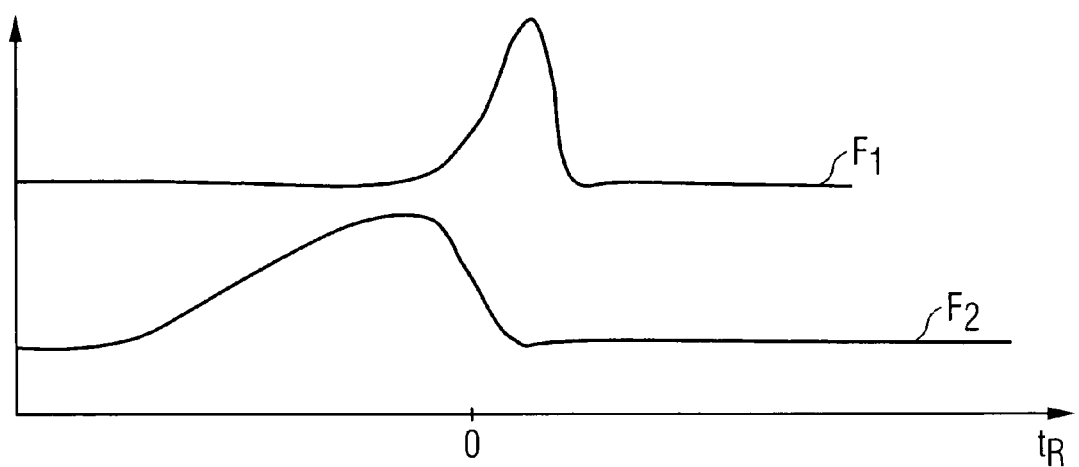
FIG. 4 illustrates the dependence of characteristic properties of the response behaviour at the output of a victim net.

Considering a single victim net, the maximum delay and the maximum transition time is not observed at the same relative timing of the input signal of the aggressor net with respect to the input signal of the victim net. This is illustrated in FIG. 4, wherein the value of the transition time, denoted by $F_1$, and the value of the delay, denoted by $F_2$, are illustrated as a function of the timing $t_R$ of the input signal of the aggressor net relative to the timing of the input signal of the victim net. It is observed that the maximum delay typically occurs when the signal transition of the aggressor net is in the first half of the signal transition of the victim net and that the maximum transition time occurs when the signal transition of the aggressor net is in the second half of the signal transition of the victim net. It is therefore too pessimistic to consider individually the worst-case-scenario for the delay and the worst-case-scenario for the transition time, as these scenarios cannot occur simultaneously. This is avoided by evaluating the output behaviour with respect to the delay taking into account the load on the output of the victim net, i.e. by evaluating the characteristic property of the response behaviour at the output of the next victim net, as it is done with the three-section simulation window.

Figure 5:
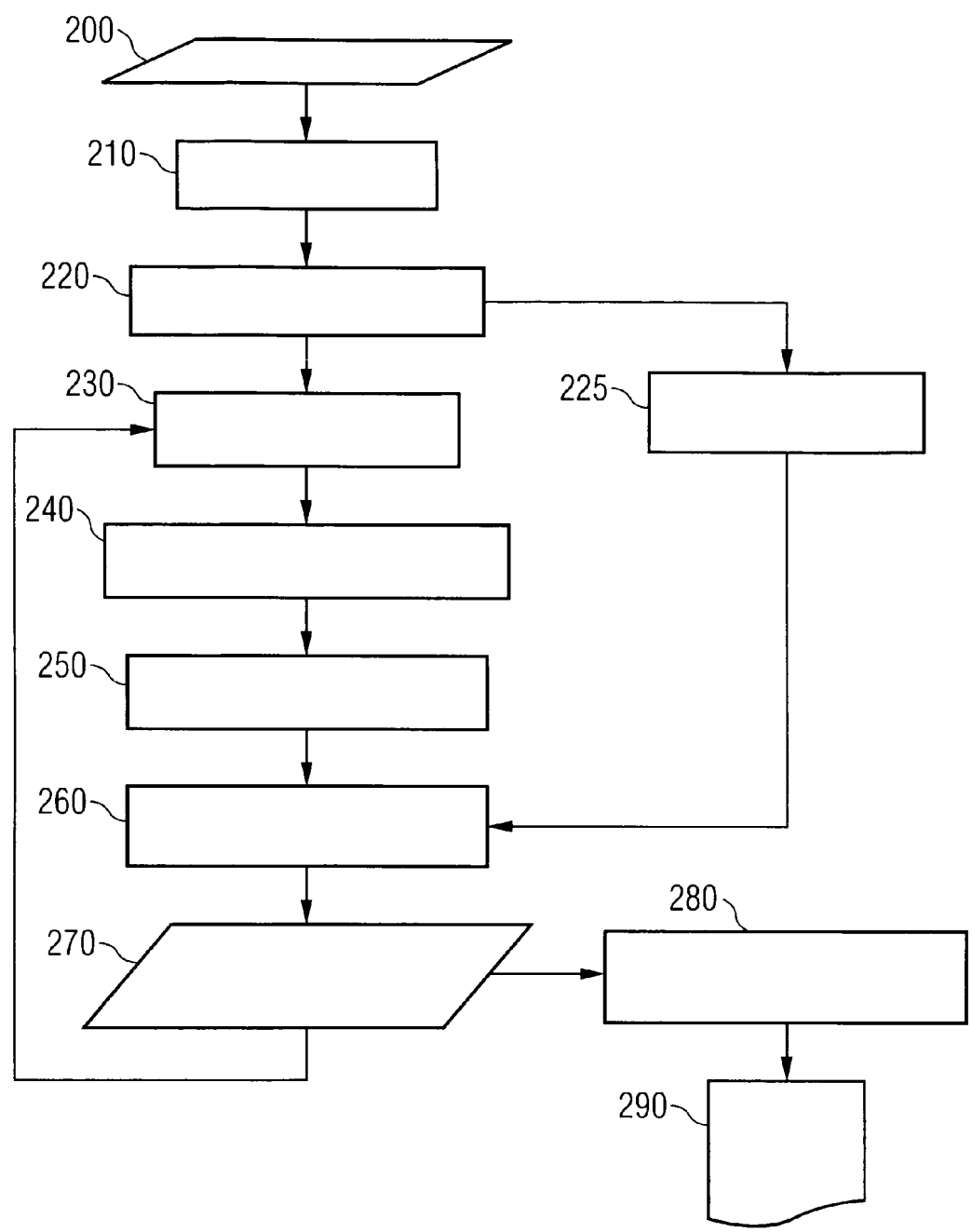
FIG. 5 shows a flow chart illustrating the method for analyzing crosstalk induced effects in the signal path of the electronic device.

FIG. 5 illustrates by means of a flow chart the method or analyzing the crosstalk effects, and in particular the delay, in a signal path as shown in FIG. 3. The method starts with specification step 200, in which the signal path is specified in a circuit description of the electronic device. This can be done manually or automatically, e.g. on the basis of a static timing analysis.

In extraction step 210, the signal path is extracted from the circuit description and in modeling step 220 a transistor-level model description of the signal path is created. From this model description, in step 225, descriptive data of the aggressor nets is extracted.

The iterative simulation starts at iteration step 230 with the first victim net located at the most upstream position of the signal path. In simulation-window definition step 240, the three-section simulation window is built around the presently evaluated victim net, including in the first section the previously evaluated victim net and in the second or middle section a presently evaluated victim net and in the third section a victim net located at the output of the presently evaluated victim net, which is to be evaluated in the next iteration. In case that the presently evaluated victim net is the first victim net, the wave form of the signal to be applied to the presently evaluated victim net is directly derived from the idealized wave form applied to the input of the signal path. Similarly, if the presently evaluated victim net is the last or most downstream victim net of the signal path, the third section of the three-section simulation window basically consists only of the output side driver stage which is connected to the output of the last victim net.

In output function definition step 250, an output function is defined for characteristic properties of the response behaviour observed at the output of the three-section simulation window. The output function may in particular represent the delay of the input signal applied at the input of the first section victim net with respect to the output signal observed at the output of the third section victim net. This is a preferred measure for the delay induced due to crosstalk in the victim net of the second section, as it includes the crosstalk-induced effect on the actual wave form of the signal applied to the input of the victim net of the second section and also includes the additional delay induced by the crosstalk via an increased transition time of the signal transition which is applied to the victim net of the third section.

In simulation step 260 the extremum, i.e. the maximum delay value, of the output function is evaluated by means of a global optimization algorithm based on a simplex-downhill approach. This is done in response to input parameters of the aggressor nets capacitively coupled to the presently evaluated victim net. For this purpose, descriptive data of the aggressor nets, e.g. active inputs, delay, transition time etc., are provided on the basis of the model description created in modeling step 225. The extremum evaluated on the basis of the simulation in step 260 corresponds to the worst-case-scenario with respect to the delay.

In evaluation step 270 parameters corresponding to the extremum evaluated in step 260 are calculated. These parameters include the delay $\Delta t$ of the presently evaluated victim net, the delay due to the interconnect to the next victim net and the signal amplitude $\Delta X$ and the transition time $\Delta T_s$ at the output of the presently evaluated victim net. At least some of these parameters and also the values of the input parameters, e.g. the timings T of the input signals, corresponding to the extremum evaluated in simulation step 260 are reused as fixed input parameters for the next iteration starting at iteration step 230. The iteration stops when the last victim net of signal path has been evaluated.

The parameters calculated in evaluation step 270 are also forwarded to combining step 280 in which they are combined so as to obtain corresponding parameters of the entire signal path. In particular, the individual delays of the victim nets calculated in evaluation step 270 are added so as to obtain a total delay of the signal path. The evaluated parameters, combined or individual, are output as an analysis report 290.

Figure 6:
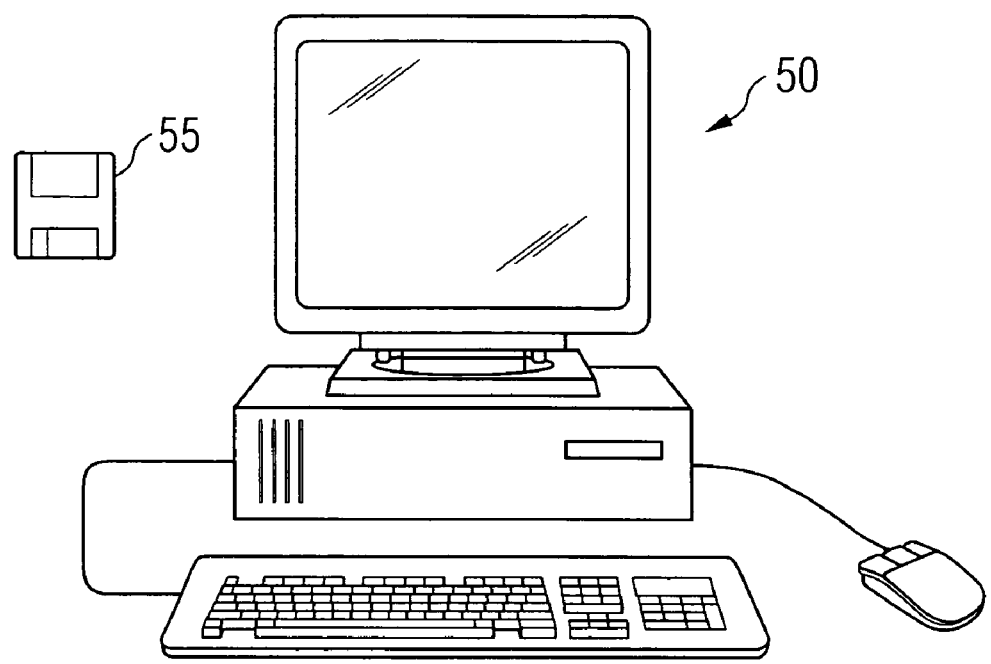
FIG. 6 shows a computer system which is, by means of a suitably designed computer software product, configured to implement the method according to the present invention.
Figure 7:
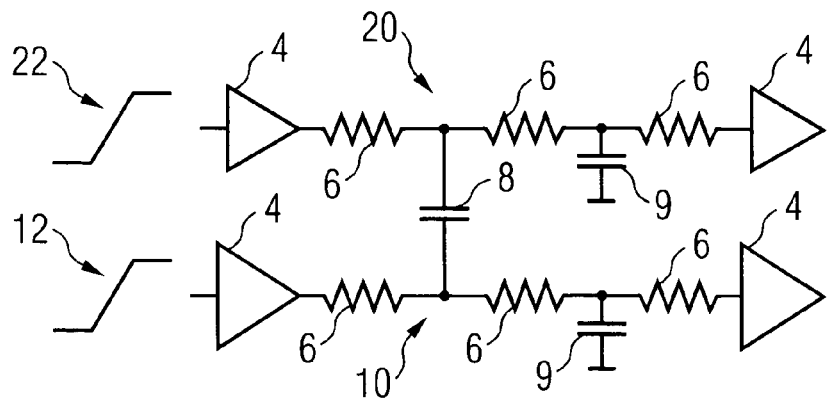
FIG. 7 shows a circuit configuration consisting of a victim net and an aggressor net.
Figure 8:
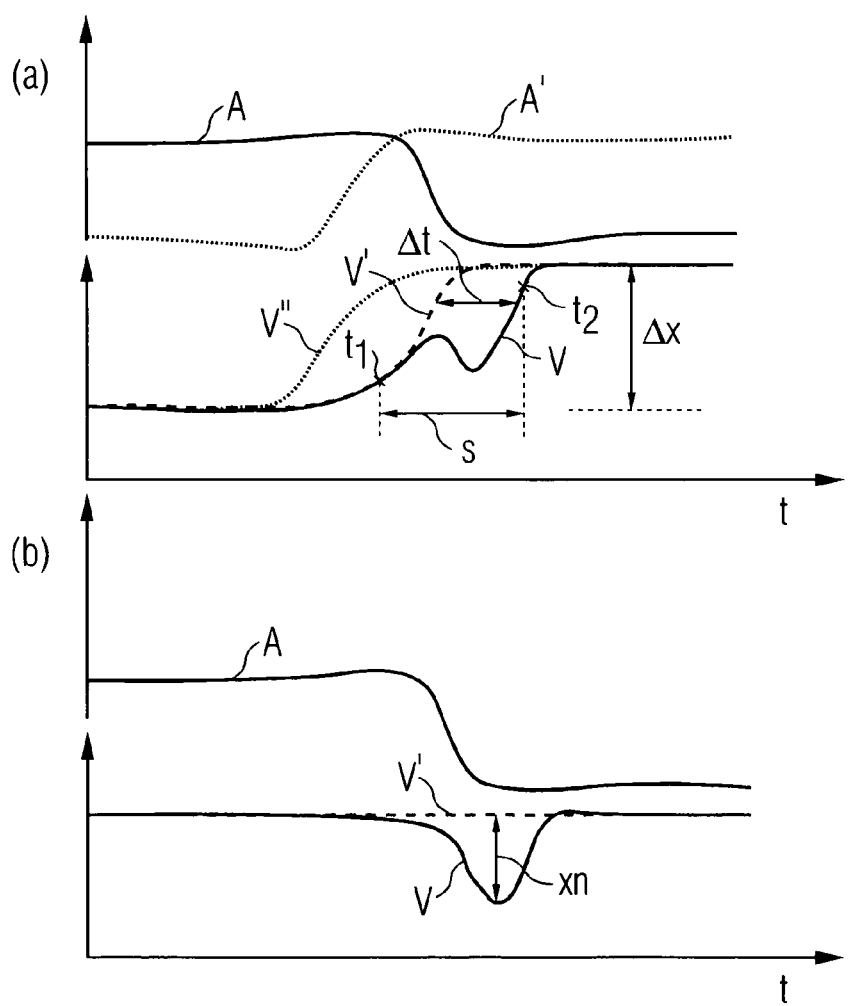
FIG. 8 illustrates different effects of crosstalk in the output signal of the victim net of FIG. 7.
Figure 9:
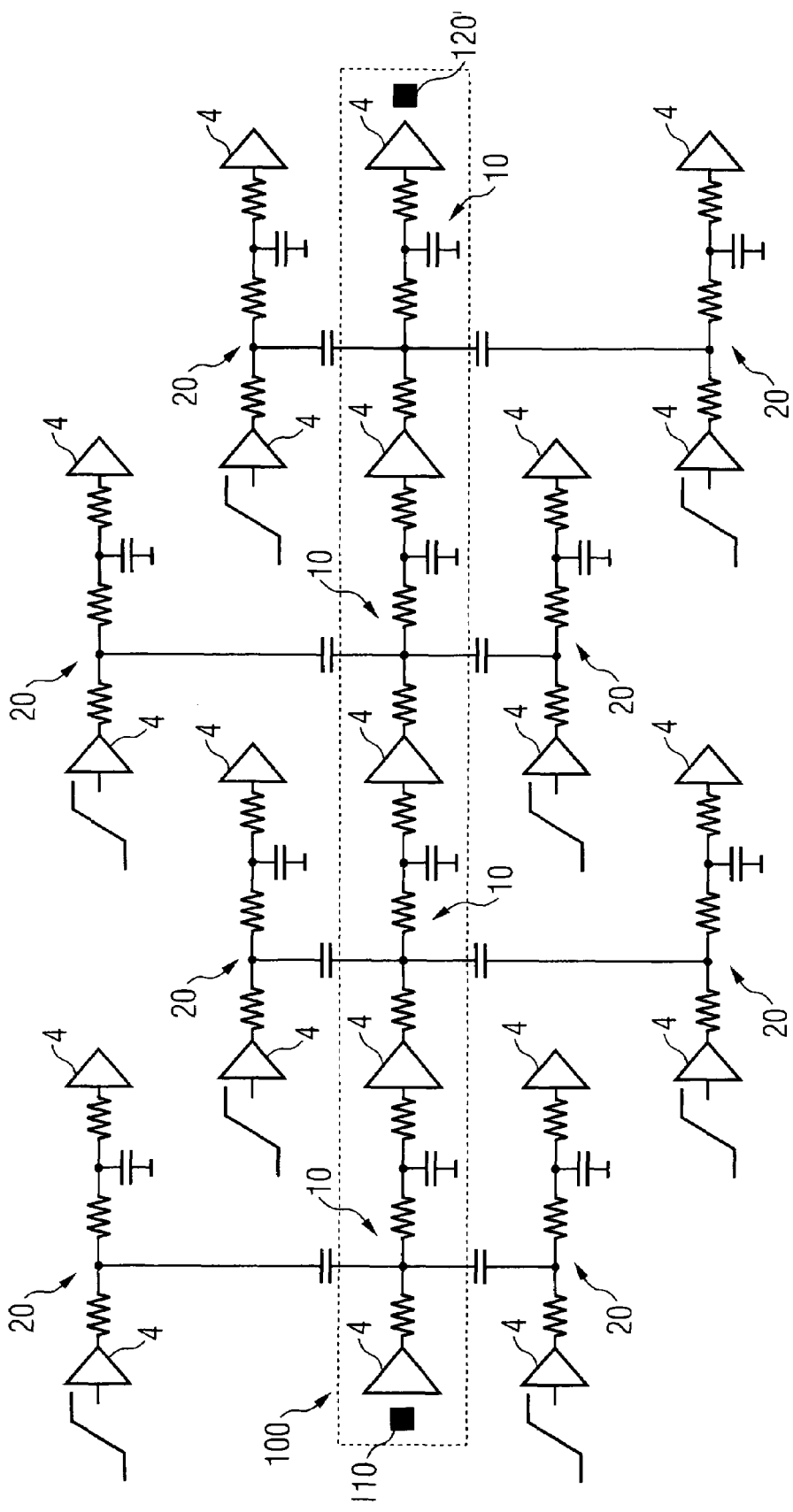
FIG. 9 illustrates a signal path consisting of a sequence of victim nets each being capacitively coupled to at least one aggressor net.

FIG. 6 shows a computer system 50 forming a device for analyzing crosstalk according to the above-described method. For this purpose, the computer system 50 is configured to implement the above-described method by means of a specifically designed computer software stored on a computer readable medium 55.

As can be seen, the above-described approach provides an accurate and at the same time efficient solution for analyzing the effects of crosstalk in an electronic device. The accuracy is in particular achieved by simulating relevant parts of the electronic device on a transistor-level basis. At the same time, a high efficiency with respect to computational effort is achieved by confining the analysis to the worst-case-scenario.

The invention claimed is:

1. A method for analyzing crosstalk effects in an electronic device comprising:
   a) providing a model description of the electronic device, the model description defining a victim net and at least one aggressor net capacitively coupled to the victim net, wherein the model description is configured for use in a simulation of the dynamic response behaviour at an output of the victim net with respect to an input signal of the victim net and/or of the at least one aggressor net, wherein the model description corresponds to a transistor-level description of the electronic device;
   b) representing a characteristic property of the dynamic response behaviour as an output function of the simulation, the output function having a value depending on at least two input parameters of the simulation, wherein the input parameters comprise a timing of a transition of the input signal of the at least one aggressor net relative to a timing of a transition of the input signal of the victim net, and wherein the output function represents (i) a measure of noise induced in the output signal of the victim net, (ii) a measure of delay of the output signal of the victim net with respect to the input signal of the victim net, or (iii) a measure of the transition time of a signal transition observed at the output of the victim net; and
   c) evaluating the output function so as to find an extremum of the output function in a preset range of the input parameters.

2. The method according to claim 1, wherein step c) further comprises using an optimization algorithm to evaluate the output function.

3. The method according to claim 2, wherein the optimization algorithm corresponds to a simplex-downhill algorithm.

4. The method according to claim 2, wherein step c) further comprises, prior to using the optimization algorithm, transforming the output function using a transformation which conserves the position of the extremum.

5. The method according to claim 1, further comprising:
   including an input driver structure of the victim net into the simulation, and simulating the input signal of the victim net based on an input signal of the driver structure, the input signal of the driver structure corresponding to a signal transition having an idealized wave form parameterized by a number of parameters which form at least a part of the input parameters of the simulation.

6. The method according to claim 5, wherein the driver structure of the victim net includes a further victim net located upstream from the victim net.

7. The method according to claim 1, further comprising:
   including a driver structure of the at least one aggressor net into the simulation, and simulating the input signal of the at least one aggressor net based on at least one input signal of the driver structure, the at least one input signal of the driver structure corresponding to a signal transition having an idealized wave form parameterized by a number of parameters, which form at least a part of the input parameters of the simulation.

8. The method according to claim 7, wherein the driver structure of the at least one aggressor net has multiple inputs and, for the simulation, only one of the inputs of the driver structure forms an active input which is subjected to the signal transition, the other inputs being subjected to a constant signal.

9. The method according to claim 8, wherein an edge direction of the signal transition applied to the active input is selected so as to obtain a signal transition at the input of the at least one aggressor net which is directed opposite to an edge direction of a signal transition applied to the input of the victim net.

10. The method according to claim 8, wherein an edge direction of the signal transition applied to the active input is selected so as to obtain a signal transition at the input of the at least one aggressor net which is directed in the same direction as the edge direction of a signal transition applied to the input of the victim net.

11. The method according to claim 8, further comprising selecting as the active input an input of the at least one aggressor net that has a signal transition with a smallest transition time.

12. The method according to claim 8, wherein the driver structure of the at least one aggressor net corresponds to a sequential circuit, and further comprising selecting as the active input the clock input of the sequential circuit.

13. The method according to claim 1, wherein an output structure of the victim net is included in the simulation.

14. The method according to claim 13, wherein the output structure of the victim net includes a further victim net located downstream from the victim net.

15. The method according to claim 1, further comprising:
   d) performing a simulation of a further victim net in a signal path with the victim net, said simulation using at least one input parameter corresponding to the extremum found in step c); and
   e) evaluating at least one characteristic descriptive of the output signal of the further victim net, depending on the values of the input parameters corresponding to the extremum of the output function.

16. The method according to claim 15, wherein the signal path comprises a sequence of more than two victim nets, and wherein steps d) and e) are repeated until the last victim net of the sequence has been evaluated.

17. The method according to claim 15, further comprising:
   determining a total capacitance for a sequence of victim nets located downstream from the victim net that are not included in the simulation of step b); and
   including the total capacitance into the simulation as a capacitive output load with respect to ground.

18. The method according to claim 15, further comprising combining values of the at least one descriptive parameter obtained for the victim set and the further victim set so as to obtain a corresponding parameter for the signal path.

19. The method according to claim 1, wherein a plurality of aggressor nets is defined and the method further comprises selectively including at least one of the aggressors net into the simulation, based on the value of the coupling capacitance of the respective aggressor net relative to the victim net.

20. The method according to claim 1, wherein the model description takes into account non-linear properties of transistors.

21. The method according to claim 1, wherein the model description is based on SPICE or HSPICE.

22. A device for analyzing crosstalk effect, comprising:
   a processing device configured to
   process descriptive data of an electronic device, the descriptive data defining a victim net and at least one aggressor net,
   simulate a response behaviour at an output of the victim net with respect to an input signal of the victim net and/or of the at least one aggressor net, represent a characteristic property of the response behaviour at an output of the victim net as an output function of the simulation, a value of the output function depending on at least two input parameters of the simulation, wherein the input parameters comprise a timing of a transition of the input signal of the at least one aggressor net relative to a timing of a transition of the input signal of the victim net, and wherein the output function represents (i) a measure of noise induced in the output signal of the victim net. (ii) a measure of delay of the output signal of the victim net with respect to the input signal of the victim net, or (iii) a measure of the transition time of a signal transition observed at the output of the victim net, and evaluate the output function so as to find an extremum of the output function in a preset range of the input parameters.

23. A computer-readable medium containing instructions for analyzing crosstalk effects in an electronic device, by:

a) providing a model description of the electronic device, the model description defining a victim net and at least one aggressor net capacitively coupled to the victim net, wherein the model description is configured for use in a simulation of a dynamic response behaviour at an output of the victim net with respect to an input signal of the victim net and/or of the at least one aggressor net;

b) representing a characteristic property of the dynamic response behaviour as an output function of the simulation, the output function having a value depending on at least two input parameters of the simulation, wherein the input parameters comprise a timing of a transition of the input signal of the at least one aggressor net relative to a timing of a transition of the input signal of the victim net, and wherein the output function represents (i) a measure of noise induced in the output signal of the victim net, (ii) a measure of delay of the output signal of the victim net with respect to the input signal of the victim net, or (iii) a measure of the transition time of a signal transition observed at the output of the victim net; and c) evaluating the output function so as to find an extremum of the output function in a preset range of the input parameters.

* * * * *